United States Patent
Kim

(10) Patent No.: US 12,044,747 B2
(45) Date of Patent: Jul. 23, 2024

(54) APPARATUS AND METHOD FOR DIAGNOSING BATTERY

(71) Applicant: LG ENERGY SOLUTION, LTD., Seoul (KR)

(72) Inventor: Young Jin Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 283 days.

(21) Appl. No.: 17/630,360

(22) PCT Filed: Dec. 9, 2020

(86) PCT No.: PCT/KR2020/017931
§ 371 (c)(1),
(2) Date: Jan. 26, 2022

(87) PCT Pub. No.: WO2021/125676
PCT Pub. Date: Jun. 24, 2021

(65) Prior Publication Data
US 2022/0276319 A1    Sep. 1, 2022

(30) Foreign Application Priority Data
Dec. 20, 2019    (KR) .................. 10-2019-0172451

(51) Int. Cl.
*G01R 31/396*    (2019.01)
*G01R 21/06*    (2006.01)
(Continued)

(52) U.S. Cl.
CPC ....... *G01R 31/396* (2019.01); *G01R 31/3648* (2013.01); *G01R 31/367* (2019.01)

(58) Field of Classification Search
CPC ...... G01R 31/36; G01R 31/367; G01R 31/38; G01R 31/3835; G01R 31/39; G01R 31/396; G01R 21/06
See application file for complete search history.

(56) References Cited

U.S. PATENT DOCUMENTS 10,429,450 B2    10/2019    Lee et al.
2013/0335009 A1    12/2013    Katsumata et al.
(Continued)

FOREIGN PATENT DOCUMENTS

EP    3 038 229 A1    6/2016
JP    2013-254664 A    12/2013
(Continued)

OTHER PUBLICATIONS

Extended European Search Report issued on Sep. 6, 2022 for the corresponding European patent application No. 20902257.3.
(Continued)

*Primary Examiner* — Neel D Shah
(74) *Attorney, Agent, or Firm* — Birch, Stewart, Kolasch & Birch, LLP

(57) ABSTRACT

An apparatus for diagnosing a battery according to an embodiment of the present invention may include microcontroller (MCU) that includes a voltage measurement unit that measures a voltage of a battery cell of a battery, a signal conversion unit that converts the voltage of the battery cell measured by the voltage measurement unit into a differential signal, and an abnormality diagnostic unit that diagnoses an abnormality of the battery cell based on the differential signal.

18 Claims, 14 Drawing Sheets

(51) Int. Cl.
  *G01R 31/36* (2020.01)
  *G01R 31/367* (2019.01)

(56) References Cited

U.S. PATENT DOCUMENTS

| | | | |
|---|---|---|---|
| 2016/0187426 A1 | 6/2016 | Delaplagne | |
| 2016/0187431 A1 | 6/2016 | Yamamoto et al. | |
| 2017/0057372 A1 | 3/2017 | Loftus et al. | |
| 2018/0203070 A1 | 7/2018 | Park | |
| 2019/0094307 A1* | 3/2019 | Brebant | G01R 31/389 |
| 2019/0181663 A1 | 6/2019 | Nishikawa et al. | |
| 2019/0187221 A1 | 6/2019 | Mukuno | |
| 2019/0242950 A1* | 8/2019 | Kishi | H01M 10/42 |

FOREIGN PATENT DOCUMENTS

| | | |
|---|---|---|
| JP | 2014-2055 A | 1/2014 |
| JP | 5662968 B2 | 2/2015 |
| JP | 2016-126894 A | 7/2016 |
| JP | 2016-531270 A | 10/2016 |
| JP | 2017-133870 A | 8/2017 |
| JP | 6295858 B2 | 3/2018 |
| JP | 6301048 B1 | 3/2018 |
| JP | 2019-113414 A | 7/2019 |
| KR | 10-2018-0085165 A | 7/2018 |
| KR | 10-2019-0030328 A | 3/2019 |
| WO | WO 2018/043222 A1 | 3/2018 |
| WO | WO2018/051885 A1 | 6/2019 |

OTHER PUBLICATIONS

Huang et al., "A Case Study Into Impacts of Usage Patterns on Lithium-Ion Battery Aging through Incremental Capacity Analysis Based Health Monitoring", IEEE, 2019, pp. 309-314.
International Search Report (PCT/ISA/210) issued in PCT/KR2020/017931 mailed on Mar. 15, 2021.

* cited by examiner

APPARATUS AND METHOD FOR DIAGNOSING BATTERY

TECHNICAL FIELD

Cross-reference to Related Application

This application claims the benefit of Korean Patent Application No. 10-2019-0172451, filed on Dec. 20, 2019, in the Korean Intellectual Property Office, the disclosure of which is incorporated herein in its entirety by reference.

Technical Field

The present invention relates to an apparatus and method for diagnosing a battery for detecting an abnormal voltage drop phenomenon due to an internal short during charging of a battery using a differential signal.

Background Art

Recently, research and development on a secondary battery are being actively conducted. Here, the secondary battery is a battery capable of charging and discharging, and is meant to include all of a conventional Ni/Cd battery, Ni/MH battery, etc. and a recent lithium ion battery. Among the secondary batteries, the lithium ion battery has an advantage of having much higher energy density compared to the conventional Ni/Cd battery, Ni/MH battery, etc. In addition, the lithium ion battery can be manufactured in a small size and light weight, and thus the lithium ion battery is used as a power source for a mobile device. In addition, the lithium ion battery can be manufactured in a small size and light weight, and thus the lithium ion battery is used as a power source for a mobile device. In addition, the lithium ion battery is attracting attention as a next -generation energy storage medium as its range of use has been expanded to a power source for an electric vehicle.

In addition, the secondary battery is generally used as a battery pack including a battery module in which a plurality of battery cells are connected in series and/or in parallel. In addition, a state and operation of the battery pack are managed and controlled by a battery management system.

In the case of such a secondary battery, an abnormal voltage drop phenomenon due to an internal short may be observed during a charging cycle. As a method for diagnosing such an abnormal voltage drop, it is possible to detect whether or not the voltage decreases by measuring the voltage of the battery. However, since there are various causes for voltage decrease, it is often difficult to determine whether or not the voltage drop is due to an internal short simply by measuring the voltage only. In addition, a method of measuring resistance of the battery in real time is also used in order to diagnose abnormal voltage drop, but in the case of CP charging, there is a problem in that it is difficult to distinguish between a normal cell and a defective cell because variation in resistance computation increases due to a small change in current.

DISCLOSURE OF THE INVENTION

Technical Problem

An object of the present invention is to provide an apparatus and method for diagnosing a battery capable of accurately and easily detecting an abnormal voltage drop phenomenon due to an internal short during charging of a battery using a differential signal for the voltage of the battery.

Technical Solution

An apparatus for diagnosing a battery according to an embodiment of the present invention may include a microcontroller (MCU) including a voltage measurement unit that measures a voltage of a battery cell of the battery, a signal conversion unit that converts the voltage of the battery cell measured by the voltage measurement an it into a differential signal, and an abnormality diagnostic unit that diagnoses an abnormality of the battery cell based on the differential signal.

A method for diagnosing a battery according to an embodiment of the present invention may include measuring, by a microcontroller (MCU), a voltage of a battery cell of the battery, converting, by the MCU, the measured voltage of the battery cell into a differential signal, and diagnosing, by the MCU, an abnormality of the battery cell based on the differential signal.

Effects of the Invention

According to the apparatus and method for diagnosing a battery of the present invention, it is possible to accurately and easily detect an abnormal voltage drop phenomenon due to an internal short during charging of the battery by using a differential signal for the voltage of the battery.

MODE FOR CARRYING OUT THE INVENTION

Figure 1:
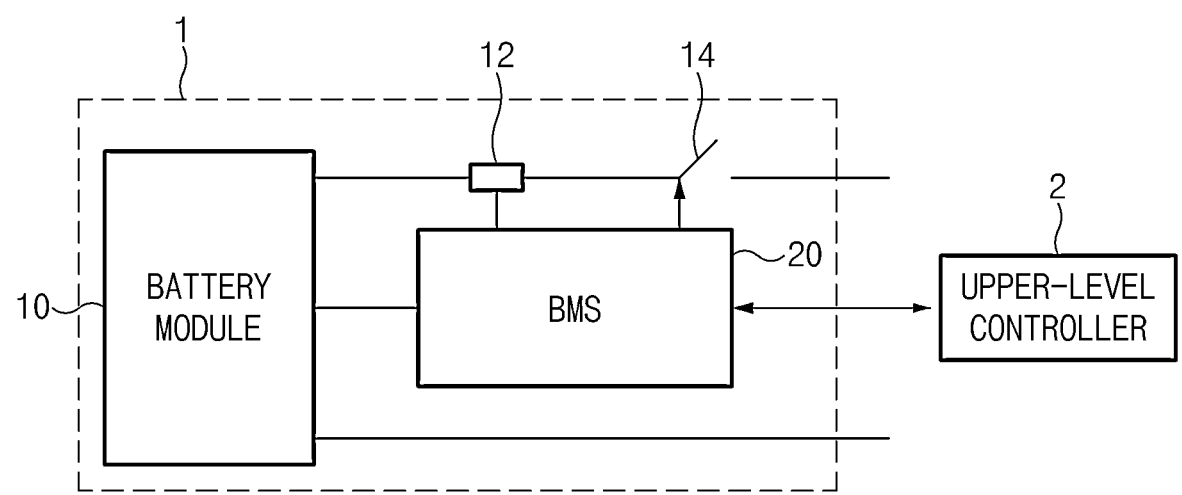
FIG. 1 is a block diagram illustrating a configuration of a battery control system.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments or the present invention disclosed in this document, specific structural or functional descriptions have been exemplified for the purpose of describing the embodiments of the present invention only, and various embodiments of the present invention may be embodied in various forms and should not be construed as being limited to the embodiments described in this document.

Expressions such as "first", "second", "firstly", or "secondly", etc. used in various embodiments may modify various constituent elements regardless of order and/or importance, and do not limit corresponding constituent elements. For example, without deviating from the scope of the present invention, a first constituent element may be named as a second constituent element, and similarly, the second constituent element may also be renamed as the first constituent element.

The terms used in this document are only used to describe a specific embodiment, and may not be intended to limit the scope of other embodiments. Singular expressions may include plural expressions unless they are clearly meant differently in the context.

All terms used herein, including technical or scientific terms, may have the same meaning as generally understood by a person having an ordinary skill in the technical field of the present invention. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

FIG. 1 is a block diagram illustrating a configuration of a battery control system.

Referring to FIG. 1, a battery management system including a battery pack 1 and an upper-level controller 2 included in an upper-level system according to an embodiment of the present invention is schematically illustrated.

As illustrated in FIG. 1, the battery pack 1 includes a battery module 10 composed of one or more battery cells and capable of charging and discharging, a switching unit 14 connected in series to a positive terminal side or a negative terminal side of the battery module 10 to control a charge and discharge current flow of the battery module 10, and a battery management system 20 that monitors a voltage, current, temperature, etc. of the battery pack 1 to control and manage the battery module 10 to prevent over-charging, over-discharging, etc.

Here, the switching unit 14 (i.e., a switch) is a semiconductor switching element for controlling a current flow for charging or discharging of the battery module 10, and, for example, at least one MOSFET may be used.

In addition, the BPS 20 may measure or calculate a voltage and current of a gate, source, and drain of the semiconductor switching element in order to monitor the voltage, current, temperature, etc. of the battery pack 1, and may measure the current, voltage, temperature, etc. of the battery pack using a sensor 12 provided adjacent to the semiconductor switching element 14. The BMS 20 is an interface that receives values obtained by measuring various parameters described above, and may include a plurality of terminals and a circuit connected to these terminals to perform processing for input values.

In addition, the EMS 20 may control ON/OFF of the switching element 14, for example, a MOSFET, and may be connected to the battery module 10 to monitor a state of the battery module 10.

The upper-level controller 2 may transmit a control signal for the battery module to the BPS 20. Accordingly, an operation of the BPS 20 may be controlled based on a signal applied from the upper-level controller. The battery cell of the present invention may be configured to be included in a battery pack used in an energy storage system (ESS) or a vehicle, etc. However, it is not limited to these uses.

Since the configuration of the battery pack 1 and the configuration of the BMS 20 are known configurations, a more detailed description thereof will be omitted.

Figure 2:
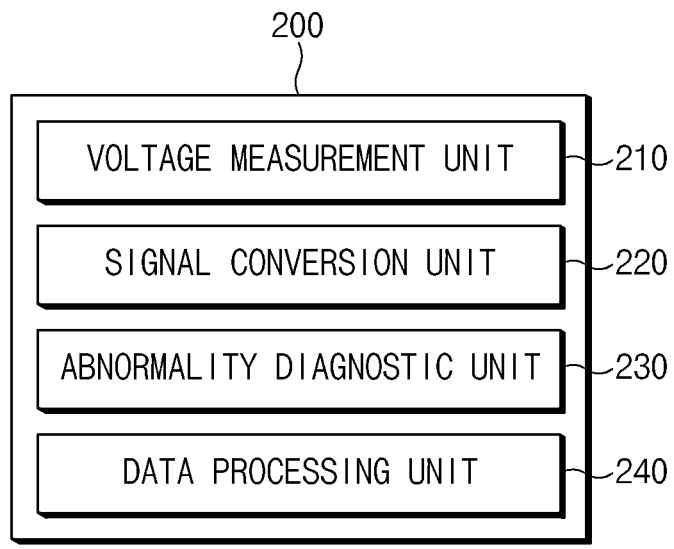
FIG. 2 is a block diagram illustrating a configuration of an apparatus for diagnosing a battery according to an embodiment of the present invention.

FIG. 2 is a block diagram illustrating a configuration of an apparatus for diagnosing a battery according to an embodiment of the present invention.

Referring to FIG. 2, an apparatus 200 for diagnosing a battery according to an embodiment of the present invention may include a voltage measurement unit 210 (i.e., voltage measurer), a signal conversion unit 220 (i.e., signal converter), an abnormality diagnostic unit 230, and a data processing unit 240 (i.e., data processor).

The voltage measurement unit 210 may measure a voltage of a battery cell. In this case, the voltage measurement unit 210 may measure the voltage of the battery cell at predetermined time intervals.

The signal conversion unit 220 may convert the voltage of the battery cell measured by the voltage measurement unit 210 into a differential signal. In this case, the signal conversion unit 220 may calculate the differential signal (e.g., dQ/dV) with respect to the capacity and voltage of the battery cell.

In addition, the signal conversion unit 220 may convert the voltage of the battery cell for a region in which the voltage of the battery cell is 4V to 4.2V into the differential signal. This is because it is possible to detect an unstable voltage profile due to an internal short of the battery in a high voltage region where the voltage of the battery cell is 4V to 4.2V and exclude the influence of differential peak change caused by other factors such as deviation or deterioration between battery cells. However, the differential signal converted by the signal converter 220 according to an embodiment of the present invention is not necessarily limited to a voltage range of 4V to 4.2V, and the voltage of the battery cell for an arbitrary voltage range may be converted into the differential signal.

The signal conversion unit 220 may calculate a statistical value for the converted differential signal. In this case, the statistical value of the differential signal calculated by the signal conversion unit 220 is to determine an abnormal behavior of the battery using a sliding window (or moving window) scheme as described later. For example, the statistical value for the differential signal may include standard deviation.

The abnormality diagnostic unit 230 may diagnose an abnormality of the battery cell based on the differential signal converted by the signal conversion unit 220. Specifically, the abnormality diagnostic unit 230 may diagnose that the abnormal voltage drop has occurred in the battery cell when the statistical value of the differential signal of the battery voltage is equal to or greater than a preset reference value.

In addition, the abnormality diagnostic unit 230 may diagnose the abnormality of the battery cell using the sliding window (or moving window) scheme with respect to the statistical value of the differential signal for the battery voltage. As described above, when the abnormality diagnostic unit 230 diagnoses the abnormality of the battery cell using the sliding window scheme, the size of the window may be arbitrarily set by the user. In this case, the statistical value of the differential signal of the battery voltage may include the standard deviation.

The data processing unit 240 may convert the voltage of the battery cell to be differentiable in a predetermined section by pre-processing voltage data of the battery cell. That is, as will be described later, a case in which differential analysis not possible may occur for generally measured voltage data of the battery due to a redundant signal and a discontinuous section. Accordingly, the data processing unit 240 may convert the voltage of the battery cell to be differential in the predetermined section by pre-processing the voltage data of the battery cell before converting the differential signal.

Specifically, the data processing unit 240 may convert the voltage of the battery cell into data in a monotonically increasing or monotonically decreasing form through sampling of the voltage data. For example, the data processing unit 240 may perform sampling on the voltage by classifying capacity values Q of the battery cells having the same voltage magnitude V and calculating an average value of the capacity values of the battery cells for each voltage magnitude. This will be described later in FIG. 4.

In addition, the data processing unit 240 may convert the voltage of the battery cell to satisfy continuity between adjacent data through a smoothing spline. Through this, a curve of the slope of the voltage data of the battery cell may be converted into a gentle shape.

Meanwhile, although not illustrated in FIG. 2, the apparatus 200 for diagnosing the battery according to the embodiment of the present invention may further include a memory unit (i.e., memory) and an alarm unit (i.e., an alarm). In this case, the memory unit may store the voltage of the battery cell measured by the voltage measurement unit 210, a differential signal of the voltage calculated by the signal conversion unit 220, etc. In this case, the memory unit 240 may be included in the apparatus 20 for diagnosing the battery, and may be included in an external server (not illustrated) to transmit and receive data to and from the apparatus 20 for diagnosing the battery through a separate communication module.

In addition, the alarm unit 250 may generate a warning alarm when it is determined by the diagnostic unit 230 that an abnormality has occurred in the battery cell. In this case, the warning alarm may be provided in the form of a message on a display unit (not illustrated), or may be provided as light or sound signals.

As described above, according to the apparatus for diagnosing the battery according to the embodiment of the present invention, it is possible to accurately and easily detect the abnormal voltage drop phenomenon due to the internal short during charging of the battery by using the differential signal for the voltage of the battery.

Figure 3A:
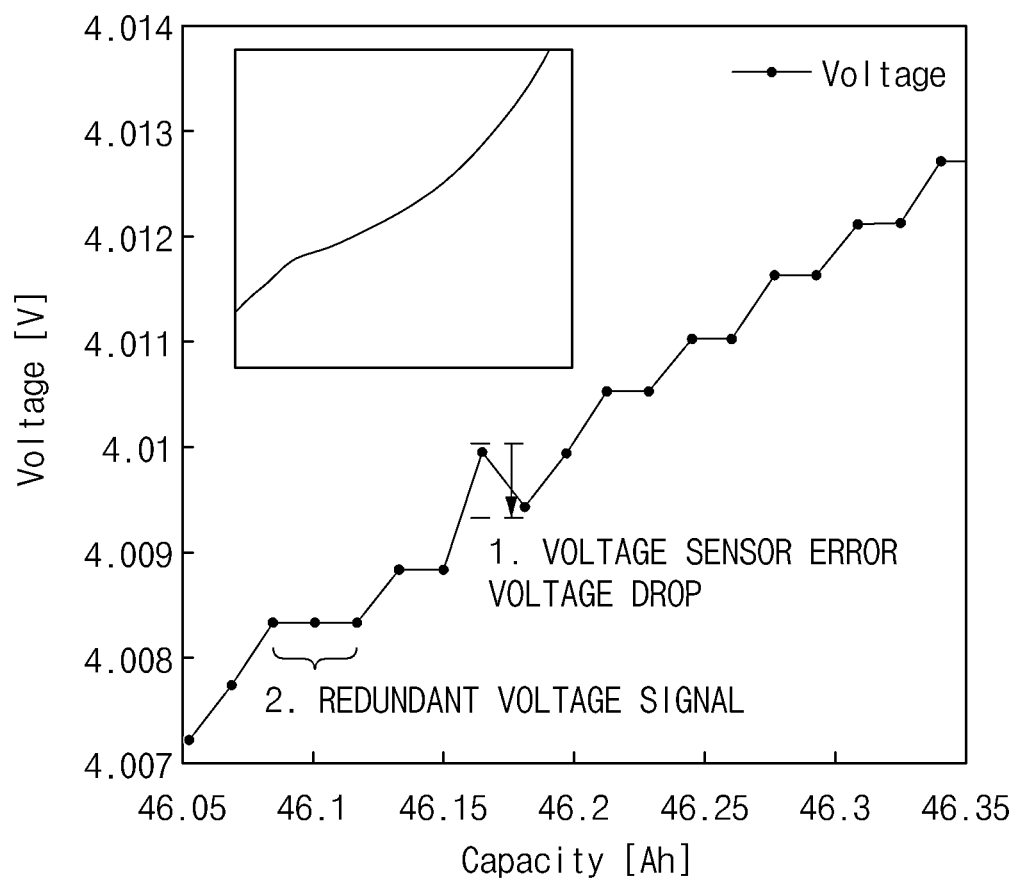
FIG. 3A as a graph illustrating raw data of a measured voltage of a battery.
Figure 3B:
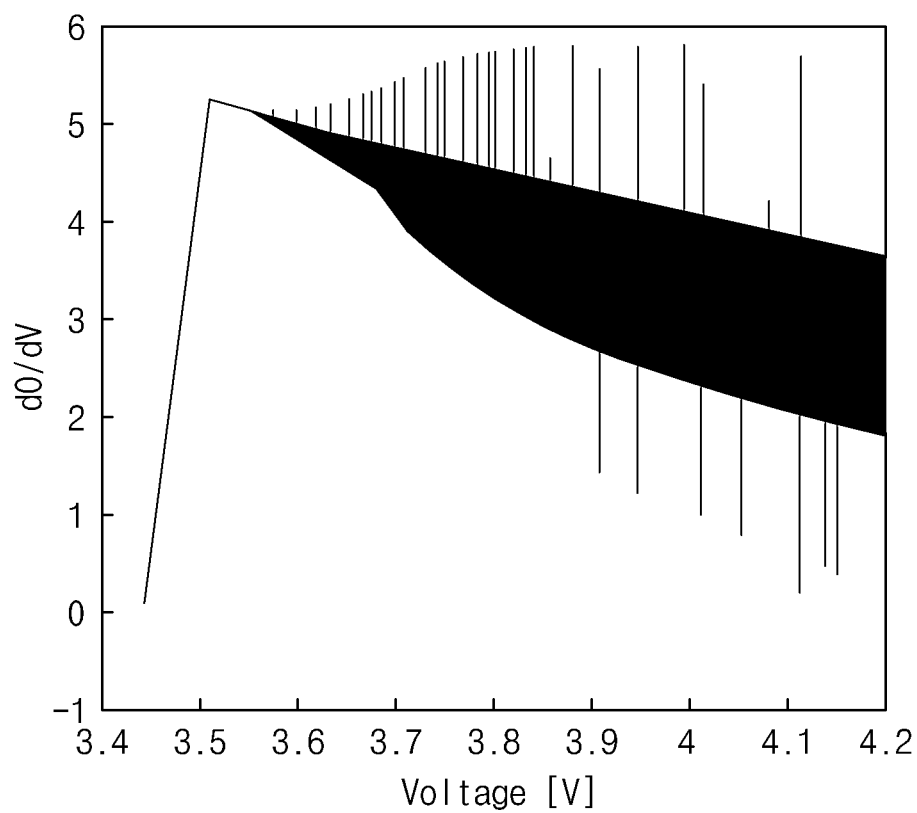
FIG. 3B is a graph illustrating a differential signal of voltage raw data of FIG. 3A.

FIG. 3A is a graph illustrating raw data of the measured voltage of the battery, and FIG. 3B is a graph illustrating the differential signal of the voltage raw data of FIG. 3A. In this case, the horizontal axis of FIG. 3A represents capacity (Ah) of the battery, and the vertical axis represents measured voltage (V) of the battery. In addition, the horizontal axis of FIG. 3B represents voltage (V) of the battery, and the vertical axis represents the differential signal (dQ/dV) for the capacity and voltage or the battery.

Referring to FIG. 3A, noise or a redundant voltage signal due to an error of the voltage sensor itself may appear in the measured voltage data of the battery. Accordingly, as illustrated in FIG. 3B, it may be difficult to analyze the differential signal for voltage or current data.

Figure 4:
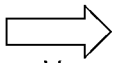
FIG. 4 is a diagram illustrating a method of performing sampling in order to remove redundant signals of battery voltage data.

FIG. 4 is a diagram illustrating a method of performing sampling in order to remove redundant signals of battery voltage data.

Referring to FIG. 4, measurement data of the capacity and voltage of the battery for respective times are illustrated. Here, the voltage is the same as 3.23V in sections where the battery capacities are 43 Ah, 44 Ah, and 46 Ah, and the voltage is the same as 3.24V in sections where the battery capacities are 45 Ah and 47 Ah. Accordingly, as illustrated in FIGS. 3A and 3B, the redundant signals of voltage data may occur, which makes differential analysis impossible.

In this case, the battery voltage data may be sampled by classifying the capacity values of the battery with the voltage of a specific magnitude as a reference with respect to the capacity and voltage data of the battery and computing an average value of the capacity values. For example, as illustrated in FIG. 4, the average value of the capacity values corresponding to each voltage may be computed with the battery voltages of 3.23V and 3.24V, which are overlapping battery voltages, as the reference. For example, when the voltage is 3.23V, 44.3 Ah, which is the average value of the battery capacities of 43 Ah, 44 Ah, and 46 Ah, may be determined as the capacity value, and when the voltage is 3.24V, 46 Ah, which is the average value of the battery capacities of 45 Ah and 47 Ah, may be determined as the capacity value.

As described above, in the apparatus for diagnosing the battery according to the embodiment of the present invention, by performing sampling through the method illustrated in FIG. 4, voltage data may be converted into a monotonically increasing (or monotonically decreasing) form with the measured voltage as a reference.

Figure 5A:
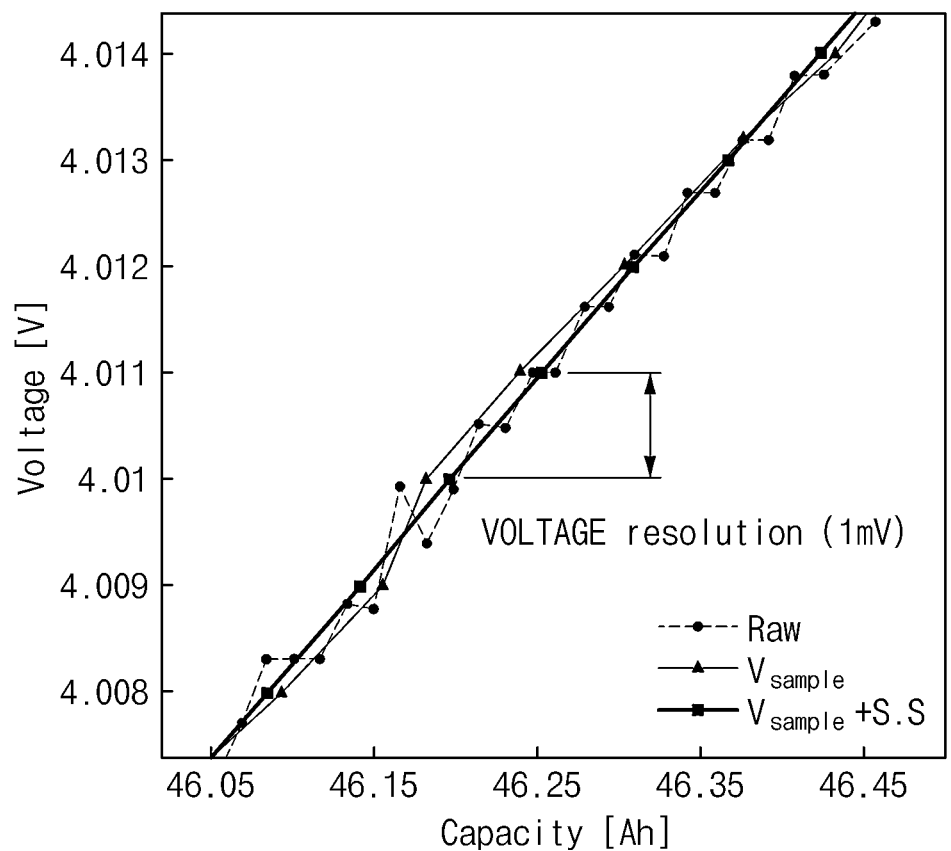
FIG. 5A is a graph illustrating a result obtained by performing pre-processing on battery voltage data through sampling and a smoothing spline.
Figure 5B:
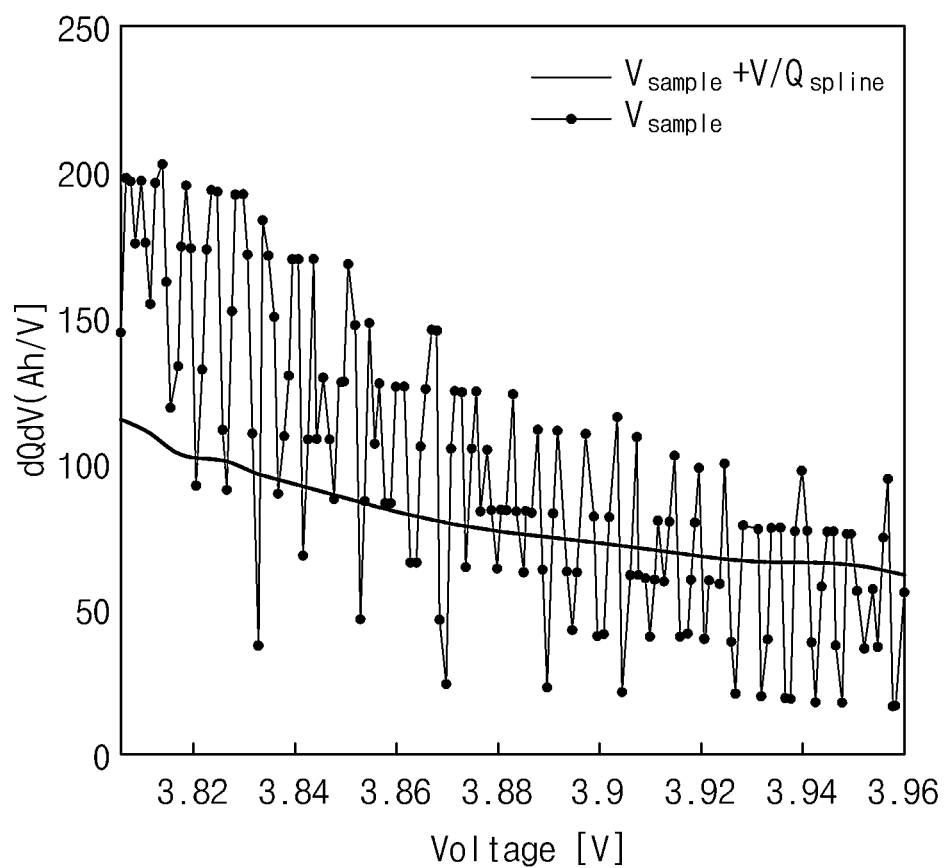
FIG. 5B is a graph illustrating a differential profile for each step of pre-processing of the battery voltage data.

FIG. 5A is a graph illustrating a result obtained by performing pre-processing on battery voltage data through sampling and a smoothing spline, and FIG. 5B is a graph illustrating a differential profile for each step of pre-processing of the battery voltage data. In this case, the horizontal axis of FIG. 5A represents capacity (Ah) of the battery, and the vertical axis represents measured voltage (V) of the battery. In addition, the horizontal axis of FIG. 5B represents voltage (V) of the battery, and the vertical axis represents the differential signal (Ah/V) for the capacity and voltage of the battery.

As illustrated in FIG. 5A, redundant signals and noise are generated in the case of raw data of the voltage, but it may be seen that the voltage data subjected to sampling processing according to FIG. 4 appears in a monotonically increasing form.

On the other hand, even if sampling processing is performed on the raw data of the voltage, a section in which differentiation is not possible may appear due to a difference in slope between adjacent pieces of data. In this regard, referring to FIG. 5B, it may be seen that when only the sampling processing as performed on the raw data of the voltage, the value of the differential signal fails to appear completely.

Accordingly, by performing the smoothing spline on the data subjected to the sampling processing, the voltage data may be converted so that the slope of the voltage data of the battery satisfies continuity. For example, the computation equation of the smoothing spline may be expressed as follows.

$$\sum_{i=1}^{n}\{Y_i - \hat{f}(x_i)\}^2 + \lambda \int \hat{f}''(x)^2 dx$$

Through the smoothing spline equation, the slope of the sampled voltage data may be prevented from rapidly changing and converted into a continuous curve. In this case, the larger the λ value, the gentler the curve becomes. For example, the λ values may be 0.001(V) and 0.01(Q), respectively.

Referring again to FIG. 5A, it may be seen that when the smoothing spline (S.S) is applied to the data subjected to sampling processing, the voltage data is converted into a differentiable form while satisfying the continuity of the slope of the voltage data. In addition, as illustrated in FIG. 5B, in the case of a differential signal subjected to the smoothing spline (S.S) in addition to the sampling process, it may be seen that the graph gently appears without noise.

As described above, according to the apparatus for diagnosing the battery according to the embodiment of the present invention, the data may be converted so as to be differentiable by performing preprocessing through the method described above before detecting the abnormal voltage drop using the differential signal of the battery voltage.

Figure 6:
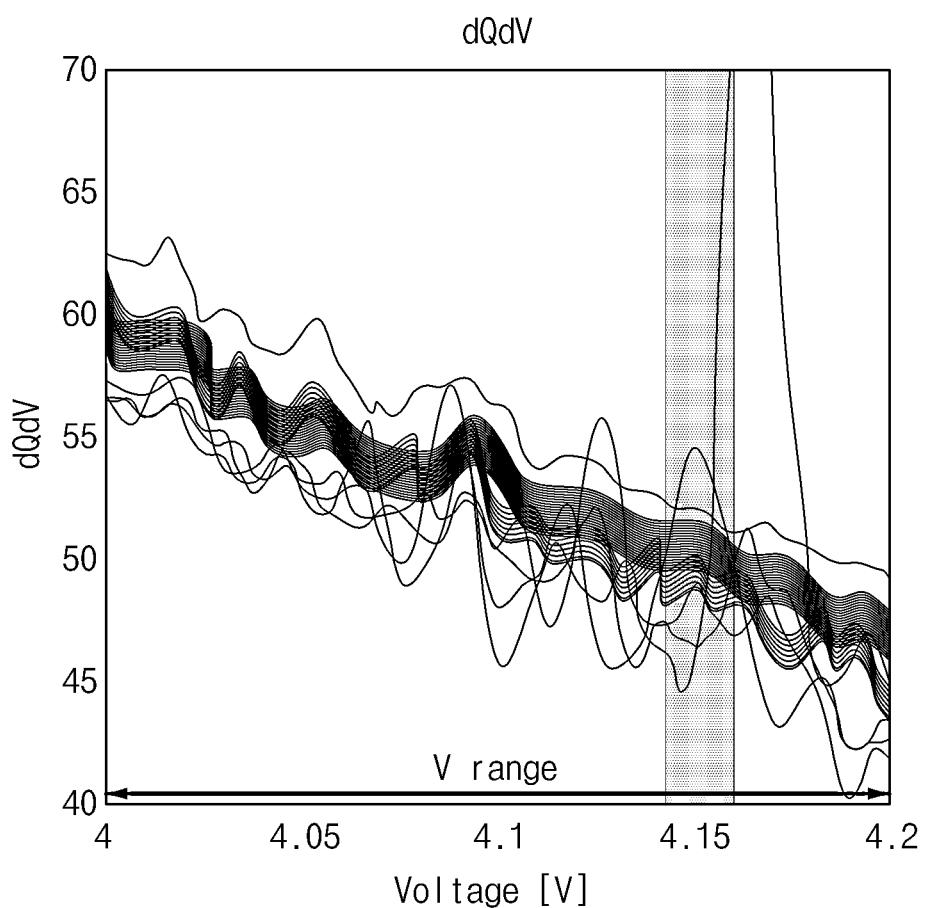
FIG. 6 is a graph illustrating an unstable behavior due to an abnormal voltage drop through a differential signal with respect to a battery voltage.

FIG. 6 is a graph illustrating an unstable behavior due to an abnormal voltage drop through a differential signal with respect to a battery voltage. In this case, the horizontal axis of FIG. 6 represents the voltage of the battery, and the vertical axis represents the differential signal.

Referring to FIG. 6, a differential signal is illustrated for a region where the voltage of the battery cell is 4V to 4.2V and as described above, this is because it is possible to detect the unstable voltage profile due to the internal short of the battery in a high voltage region where the voltage of the battery cell is 4V to 4.2V and exclude the influence of differential peak change caused by other factors such as deviation or deterioration between battery cells.

In addition, FIG. 6 schematically illustrates a change in the differential signal according to each charging cycle. As illustrated in FIG. 6, it may be seen that a section in which the differential signal is unstable (the part 4.18V of FIG. 6) appears in a specific charging cycle.

Figure 7A:
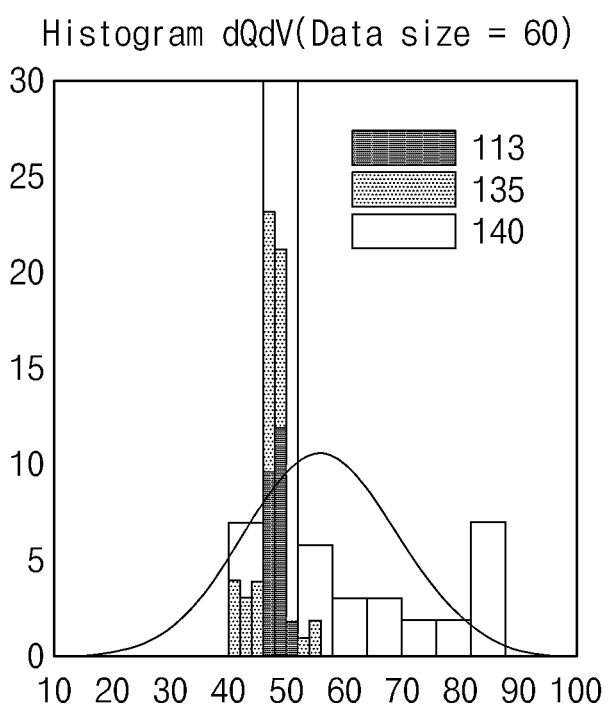
FIG. 7A illustrates a histogram of a differential signal for each charging cycle of a battery.
Figure 7B:
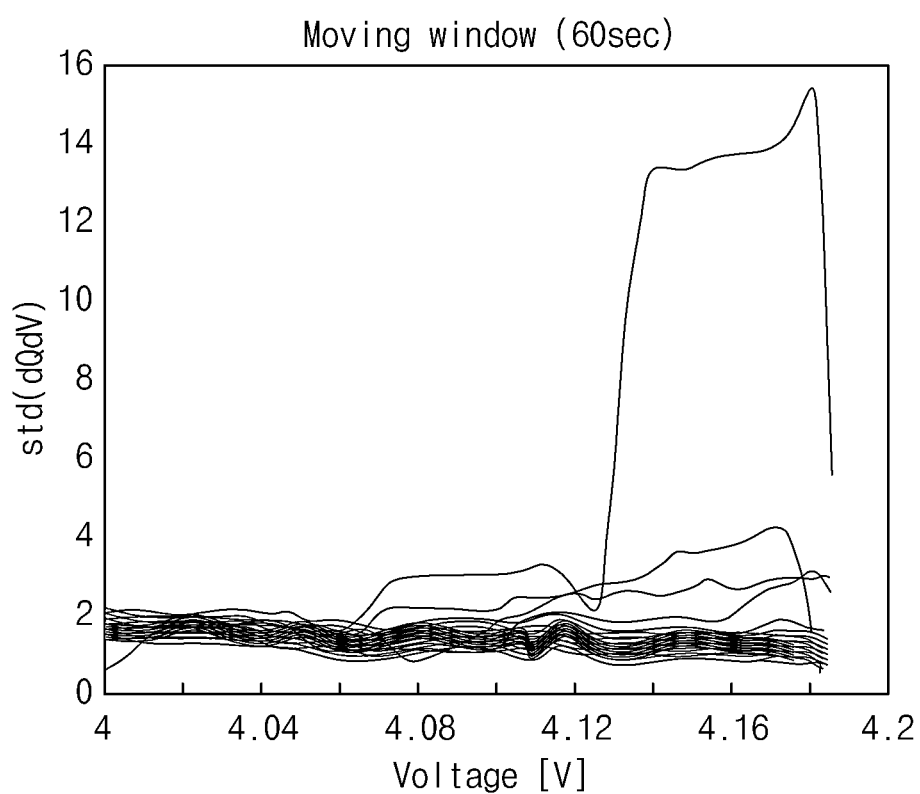
FIG. 7B is a graph illustrating standard deviation for each charging cycle of the battery.

FIG. 7A illustrates a histogram of a differential signal for each charging cycle of a battery, and FIG. 7B is a graph illustrating standard deviation for each charging cycle of the battery. In this case, the horizontal axis of FIG. 7A represents bins of the differential signal values, and the vertical axis represents the number of differential signal values. In addition, the horizontal axis of FIG. 7B represents the voltage (V), and the vertical axis represents the standard deviation of the differential signal. Meanwhile, in the case of FIGS. 7A and 7B, the results derived by setting the size of the moving (sliding) window to 60 are illustrated.

Referring to FIG. 7A, a histogram of the differential signals for the case where the charging cycles are 113, 135, and 140, respectively, is illustrated. As illustrated in FIG. 7A, it may be seen that when the charging cycle is 113, a profile of a normal charging state appears, but when the charging cycles are 135 and 140, an unstable profile appears.

Meanwhile, referring to FIG. 7B, when the standard deviation of the differential signal is uniform with respect to the voltage, it means that the normal voltage behavior appears, and when the standard deviation of the differential signal rises rapidly in a specific voltage section, it means that unstable behavior of the voltage occurs.

In this way, it is possible to detect whether or not the voltage is unstable through the change in the standard deviation within an analysis window of the differential signal for the battery voltage. Accordingly, according to the apparatus for diagnosing the battery according to the embodiment of the present invention, it is possible to quantify a discrimination condition of normal behavior or abnormal behavior of the battery voltage.

Figure 8:
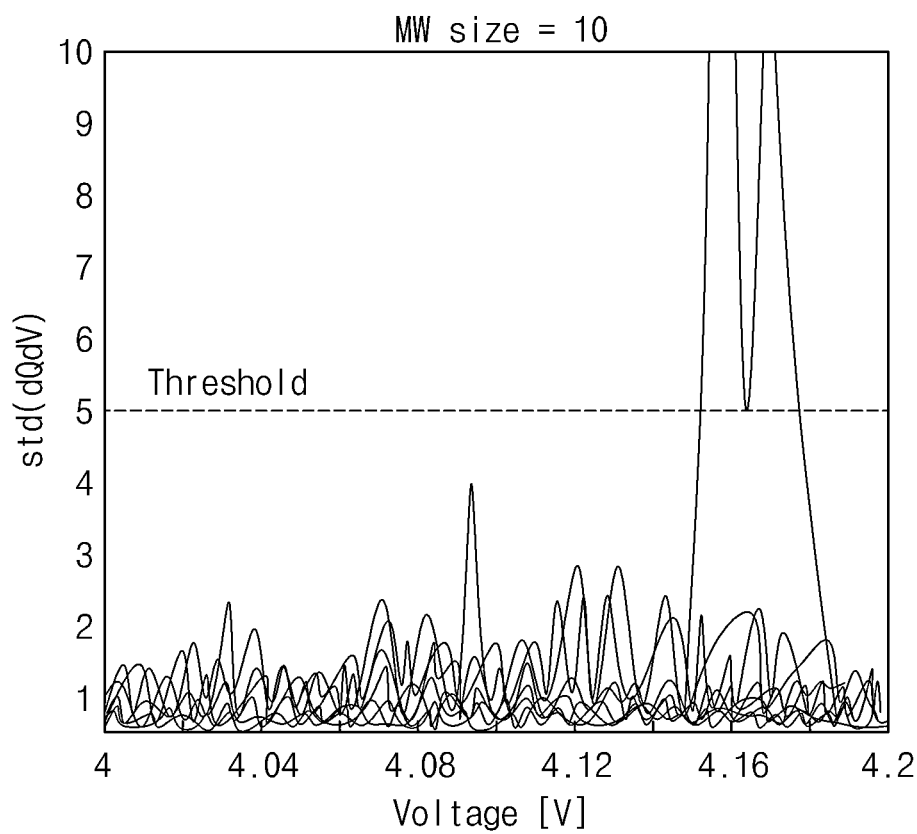
FIG. 8 is a graph illustrating diagnosis of an abnormality in a battery through a standard deviation of the differential signal in the apparatus for diagnosing the battery according to the embodiment of the present invention.

FIG. 8 is a graph illustrating diagnosis of an abnormality in a battery through a standard deviation of the differential signal in the apparatus for diagnosing a battery according to the embodiment of the present invention. In this case, FIG. 8 illustrates the result derived by setting the size of the moving (sliding) window to 10, and the horizontal axis represents the voltage (V), and the vertical axis represents the standard deviation of the differential signal.

As illustrated in FIG. 8, the apparatus for diagnosing the battery according to the embodiment of the present invention may diagnose an abnormal voltage drop due to the internal short of the battery based on whether or not the standard deviation of the differential signal is equal to or greater than a preset reference value. For example, referring to FIG. 8, it may be determined that the abnormal voltage drop has occurred in a region in which the battery voltage is 4.16V to 4.18V.

Meanwhile, in the case of using the standard deviation of the differential signal as illustrated in FIG. 8, power of discrimination of the unstable behavior increases as the size of the sliding window decreases, and thus it is possible to more easily and accurately detect the voltage drop phenomenon.

In addition, in the above description, it has been described that whether or not it is abnormal is determined using the standard deviation of the differential signal of the battery voltage, but the present invention is not limited thereto, and various statistical values such as an average value, a median value, an external degree, and a kurtosis of the differential signal may be used, in addition to the standard deviation.

Figure 9:
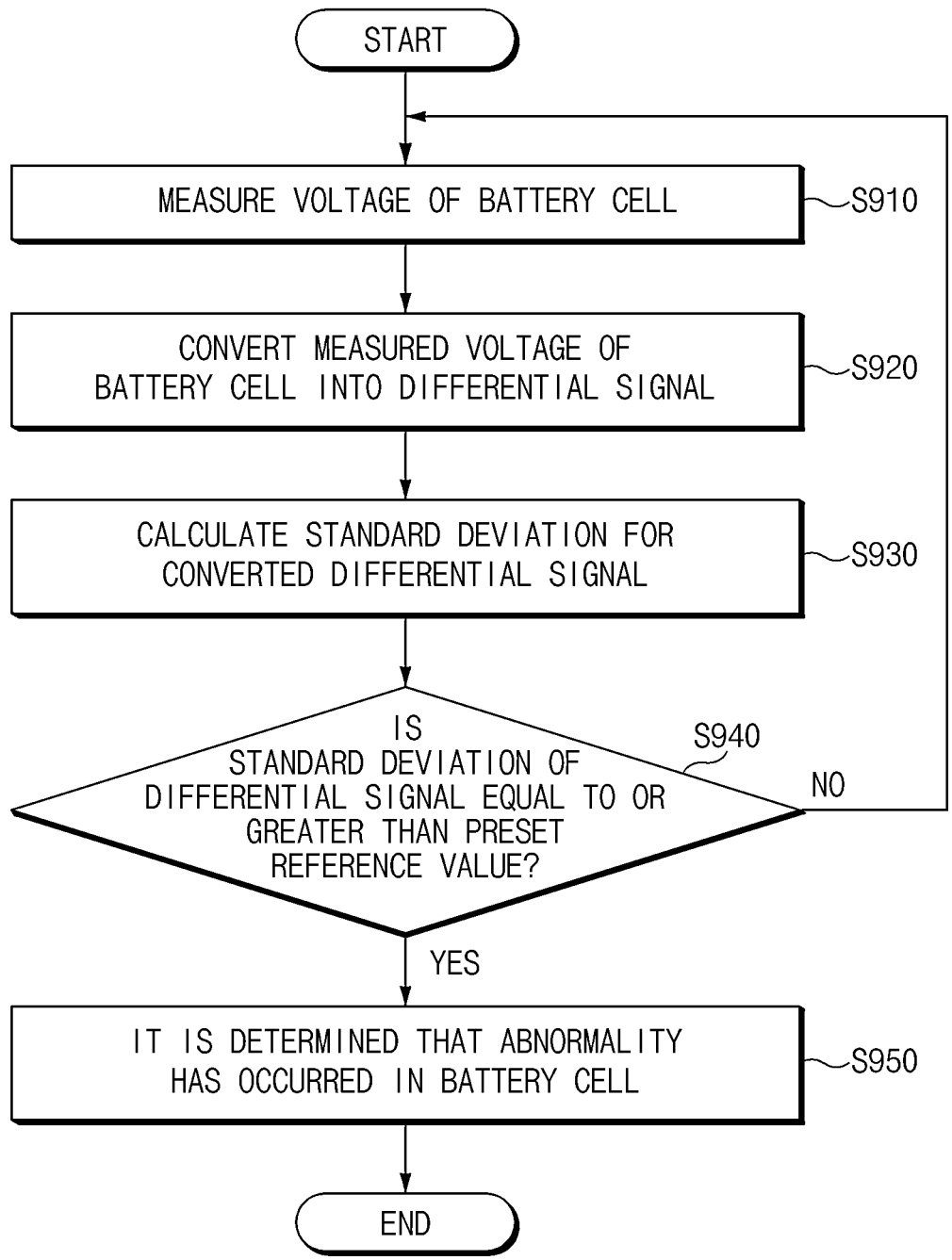
FIG. 9 is a flowchart illustrating a method for diagnosing a battery according to an embodiment of the present invention.

FIG. 9 is a flowchart illustrating a method for diagnosing a battery according to an embodiment of the present invention.

Referring to FIG. 9, first, a voltage of a battery cell is measured (S910). In this case, in step S910, the voltage of the battery cell may be measured at predetermined time intervals.

The measured voltage of the battery cell is converted into a differential signal (S920). In this case, the differential signal may be calculated with respect to the capacity and voltage of the battery as described above. In addition, a standard deviation calculated for the converted differential signal (S930). The standard deviation of the differential signal may be calculated for each charging cycle.

Next, it is determined whether or not the standard deviation of the differential signal is equal to or greater than a preset reference value (S940). In this case, abnormality diagnosis according to the standard deviation of the differential signal may be performed in a sliding (moving) window scheme, and the size of the window may be arbitrarily set by the user.

If the standard deviation for the differential signal is less than the preset reference value, the process returns to step S910. On the other hand, when the standard deviation of the differential signal is equal to or greater than the preset reference value (YES), it is determined that an abnormality of the battery cell has occurred (S950). In addition, in the above description, the abnormality of the battery cell was determined through the standard deviation of the differential signal, but various types of statistical values may be used in addition to the standard deviation.

As described above, according to the method for diagnosing the battery according to the embodiment of the present invention, it is possible to accurately and easily detect the abnormal voltage drop phenomenon due to then internal short during charging of the battery by using the differential signal for the voltage of the battery.

Figure 10:
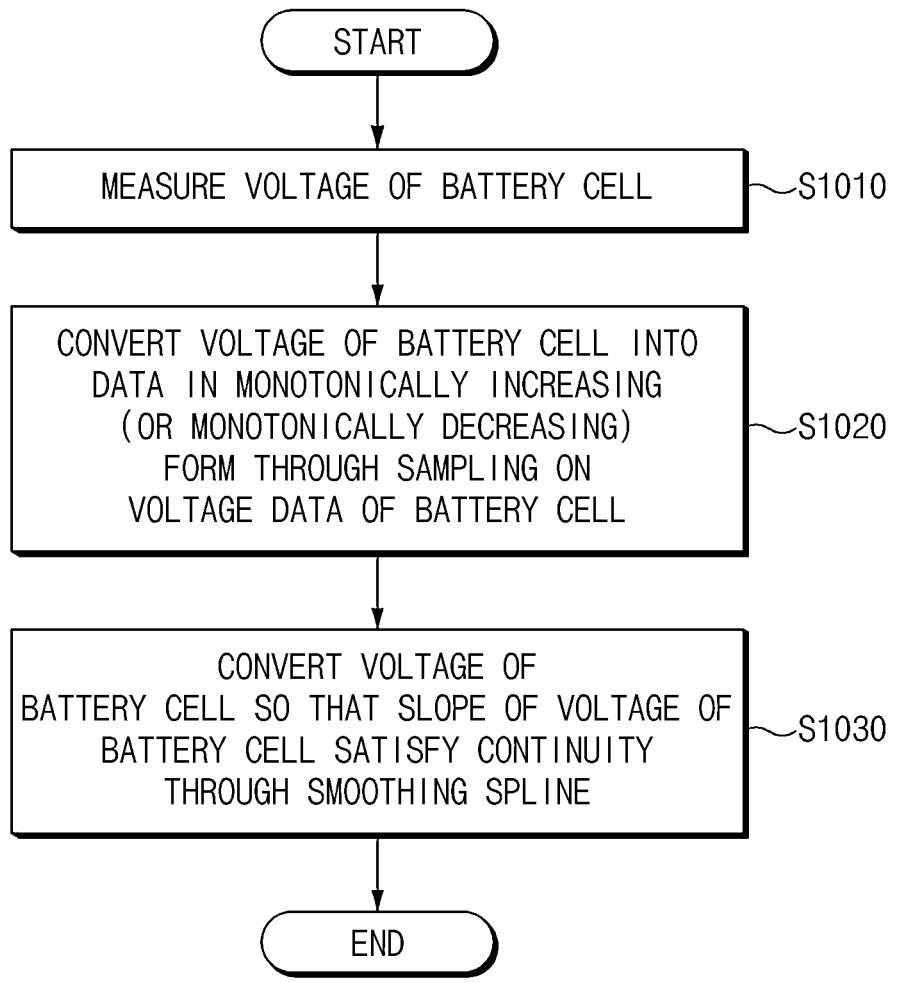
FIG. 10 is a flowchart illustrating a method of preprocessing data in the method for diagnosing the battery according to the embodiment of the present invention.

FIG. 10 is a flowchart illustrating a method of preprocessing data in the method for diagnosing the battery according to the embodiment of the present invention.

Referring to FIG. 10, first, the voltage of the battery cell is measured (S1010). Then, the voltage of the battery cell is converted into data in a monotonically increasing (or monotonically decreasing) form through sampling of the measured voltage data (S1020). Next, the voltage of the battery cell is converted so that the slope of the voltage of the battery cell satisfies continuity through a smoothing spline (S1030). Since detailed contents of the method of preprocessing data according to FIG. 10 have been described above, detailed descriptions thereof are omitted.

As described above, in the method for diagnosing the battery according to the embodiment of the present invention, by performing the pre-processing on the voltage data, it is possible to allow the differential analysis to be performed by converting the voltage data in which noise, redundant signals, discontinuous sections, etc. exist to be differentiable in a predetermined section.

Figure 11:
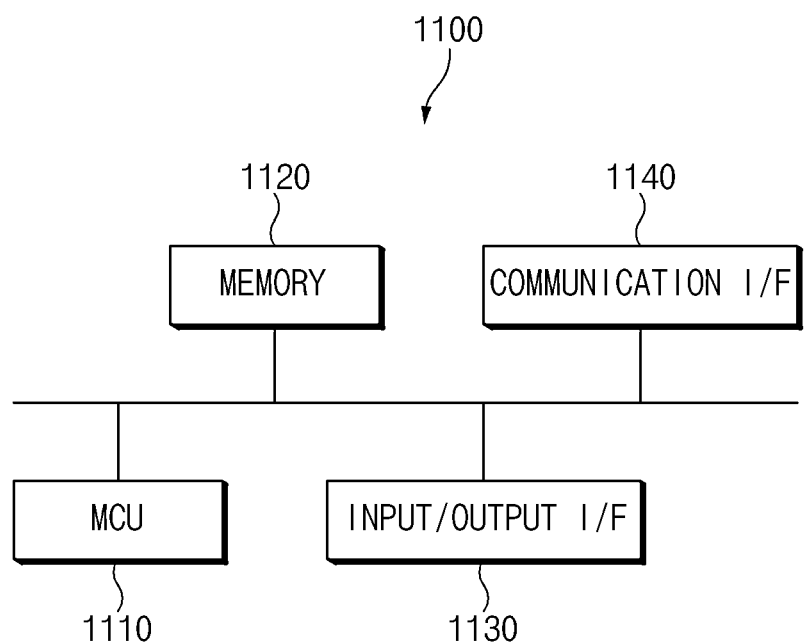
FIG. 11 is a diagram illustrating a hardware configuration of the apparatus for diagnosing the battery according to the embodiment of the present invention.

FIG. 11 is a diagram illustrating a hardware configuration of the apparatus for diagnosing the battery according to the embodiment of the present invention.

Referring to FIG. 11, an apparatus 1100 for diagnosing a battery may include a microcontroller (MCU) 1110 that controls various processes and configurations, a memory 1120 in which an operating system program and various programs (e.g., a battery diagnostic program, a differential signal calculation program, etc.) are recorded, an input/output interface 1130 that provides an input interface and an output interface between the battery cell module and/or the semiconductor switching element, and communication interface 1140 capable of communicating with the outside through a wired or wireless communication network. As described above, the computer program according to the present invention may be implemented as, for example, a module that performs each functional block illustrated in FIG. 2 by being recorded in the memory 1120 and processed by the microcontroller 1110.

In the above description, just because all constituent elements constituting an embodiment of the present invention are described as being combined into one or operating in combination, the present invention is not necessarily limited to these embodiments. That is, as long as it is within the scope of the object of the present invention, all constituent elements may be selectively combined and operated in one or more.

In addition, the terms such as "include", "configure" or "have" described above mean that the corresponding constituent element may be embedded unless otherwise particularly described, and thus the terms should be interpreted as being capable of further including other constituent elements, rather than excluding other constituent elements. All terms used herein including technical or scientific terms may have the same meaning as generally understood by a person having an ordinary skill in the technical field to which the present invention pertains, unless otherwise defined. Terms generally used, such as terms defined in the dictionary, should be interpreted as being consistent with the meaning of the context of related technology, and are not to be interpreted as an ideal or excessively formal meaning unless explicitly defined in the present invention.

The above description is merely illustrative of the technical idea of the present invention, and those having ordinary skill in the art to which the present invention pertains will be able to make various modifications and variations thereto in a range without deviating from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of rights of the present invention.

The invention claimed is:

1. An apparatus for diagnosing a battery, the apparatus comprising:
   a microcontroller (MCU) including:
   a voltage measurement unit that measures a voltage of a battery cell of the battery;
   a signal conversion unit that converts the voltage of the battery cell measured by the voltage measurement unit into a differential signal; and
   an abnormality diagnostic unit that diagnoses an abnormality of the battery cell based on the differential signal,
   wherein the signal conversion unit calculates the differential signal with respect to a capacity and the voltage of the battery cell, and
   wherein the differential signal is expressed as dQ/dV, where dQ is a change in the capacity and dV is a change in the voltage.

2. The apparatus of claim 1, wherein the signal conversion unit calculates a statistical value for the differential signal, and
   the abnormality diagnostic unit diagnoses that an abnormality of the battery cell has occurred when the statistical value of the differential signal is equal to or greater than a preset reference value.

3. The apparatus of claim 2, wherein the abnormality diagnostic unit diagnoses the abnormality of the battery cell using a sliding window scheme with respect to the statistical value.

4. The apparatus of claim 3, wherein the statistical value for the differential signal is a standard deviation.

5. The apparatus of claim 1, wherein the signal conversion unit converts the voltage of the battery cell into the differential signal for a region in which the voltage of the battery cell is 4V to 4.2V.

6. The apparatus of claim 1, wherein the MCU further comprises a data processing unit that converts the voltage of the battery cell to be differentiable in a preset section by pre-processing voltage data of the battery cell.

7. The apparatus of claim 6, wherein the data processing unit converts the voltage of the battery cell into data in a monotonically increasing or monotonically decreasing form through sampling of the voltage data.

8. The apparatus of claim 7, wherein the data processing unit perform sampling on the voltage by classifying capacity values of the battery cells having the same voltage magnitude and calculating an average value of the capacity values of the battery cells for each voltage magnitude.

9. The apparatus of claim 6, wherein the data processing unit converts the voltage of the battery cell so that a slope of the voltage of the battery cell satisfies continuity through a smoothing spline.

10. The apparatus of claim 6, wherein the data processing unit pre-processes the voltage data of the battery cell that includes at least one of a redundant signal and a discontinuous section.

11. A method for diagnosing a battery, the method comprising:
measuring, by a microcontroller (MCU) a voltage of a battery cell of the battery;
converting, by the MCU, the measured voltage of the battery cell into a differential signal; and
diagnosing, by the MCU, an abnormality of the battery cell based on the differential signal,
wherein the differential signal is calculated with respect to a capacity and the voltage of the battery cell, and
wherein the differential signal is expressed as dQ/dV, where dQ is a change in the capacity and dV is a change in the voltage.

12. The method of claim 11, further comprising:
calculating, by the MCU, a statistical value for the differential signal; and
diagnosing, by the MCU, that an abnormality of the battery cell has occurred when the statistical value of the differential signal is equal to or greater than a preset reference value.

13. The method of claim 12, further comprising:
diagnosing, by the MCU, the abnormality of the battery cell using a sliding window scheme with respect to the statistical value.

14. The method of claim 13, wherein the statistical value for the differential signal is a standard deviation.

15. The method of claim 11, further comprising:
converting, by the MCU, the voltage of the battery cell to be differentiable in a preset section by pre-processing voltage data of the battery cell.

16. The method of claim 15, wherein, in the converting the voltage of the battery cell to be differentiable in the preset section, the voltage of the battery cell is converted into data in a monotonically increasing or monotonically decreasing form through sampling of the voltage data.

17. The method of claim 15, wherein, in the converting the voltage of the battery cell to be differentiable in the preset period, the voltage of the battery cell is converted so that a slope of the voltage of the battery cell satisfies continuity through a smoothing spline.

18. The method of claim 15, wherein the data processing unit pre-processes the voltage data of the battery cell that includes at least one of a redundant signal and a discontinuous section.

* * * * *